United States Patent [19]
Ker et al.

[11] Patent Number: 5,754,380
[45] Date of Patent: May 19, 1998

[54] CMOS OUTPUT BUFFER WITH ENHANCED HIGH ESD PROTECTION CAPABILITY

[75] Inventors: Ming-Dou Ker, Tainan; Tain-Shun Wu, Miou-Lee, both of Taiwan

[73] Assignee: Industrial Technology Research Institute, Hsinchu, Taiwan

[21] Appl. No.: 419,636

[22] Filed: Apr. 6, 1995

[51] Int. Cl.$^6$ .................................................. H02H 9/00
[52] U.S. Cl. ............................ 361/56; 361/111; 361/118
[58] Field of Search ........................... 361/59, 91, 111, 361/118, 127, 115, 56

[56] References Cited

U.S. PATENT DOCUMENTS

| | | | |
|---|---|---|---|
| 4,605,980 | 8/1986 | Hartranft et al. | 361/56 |
| 4,692,781 | 9/1987 | Rountree et al. | 357/23.13 |
| 4,734,752 | 3/1988 | Liu et al. | 357/23.4 |
| 4,745,450 | 5/1988 | Hartranft et al. | 357/23.13 |
| 4,807,080 | 2/1989 | Clark | 361/56 |
| 4,819,046 | 4/1989 | Misu | 357/23.13 |
| 4,896,243 | 1/1990 | Chatterjee et al. | 362/91 |
| 4,939,616 | 7/1990 | Rountree | 361/56 |
| 5,001,529 | 3/1991 | Ohshima et al. | 357/23.13 |
| 5,010,380 | 4/1991 | Avery | 357/23.13 |
| 5,012,317 | 4/1991 | Rountree | 357/38 |
| 5,019,888 | 5/1991 | Scott et al. | 357/41 |
| 5,060,037 | 10/1991 | Rountree | 257/360 |
| 5,077,591 | 12/1991 | Chen et al. | 357/23.1 |
| 5,140,401 | 8/1992 | Ker et al. | 357/43 |
| 5,166,089 | 11/1992 | Chen et al. | 437/51 |
| 5,182,220 | 1/1993 | Ker et al. | 437/34 |
| 5,218,222 | 6/1993 | Roberts | 257/362 |
| 5,270,565 | 12/1993 | Lee et al. | 257/358 |
| 5,272,371 | 12/1993 | Bishop et al. | 257/362 |
| 5,274,262 | 12/1993 | Avery | 257/362 |
| 5,289,334 | 2/1994 | Ker et al. | 361/56 |
| 5,329,143 | 7/1994 | Chan et al. | 257/173 |
| 5,336,908 | 8/1994 | Roberts | 257/173 |
| 5,343,053 | 8/1994 | Avery | 257/173 |
| 5,400,202 | 3/1995 | Mutz et al. | 361/56 |

FOREIGN PATENT DOCUMENTS

| | | | |
|---|---|---|---|
| 4-196352 | 4/1992 | Japan | H01L 23/522 |
| 6-120494 | 6/1994 | Japan | H01L 29/784 |
| WO 90/14691 | 11/1990 | WIPO | H01L 29/06 |

OTHER PUBLICATIONS

C.Duvvury and A. Amerasekera, "ESD: A Pervasive Reliability Concern for IC Technologies", *Proc. of IEEE*, vol. 81, No. 5, pp. 690–702, May 1993.

A. Amerasekera and C. Duvvury, "The Impact of Technology Scaling on ESD Robustness and Protection Circuit Design", *1994 EOS/ESD Symp. Proc.*, EOS–16, pp. 237–245.

R.N. Rountree, "ESD Protection for Submicron CMOS Circuits: Issues and Solutions", *1988 IEDM Technical Digest*, pp. 580–583.

(List continued on next page.)

*Primary Examiner*—Jeffrey A. Gaffin
*Assistant Examiner*—Stephen Jackson
*Attorney, Agent, or Firm*—Meltzer, Lippe, Goldstein, et al.

[57] ABSTRACT

An ESD protection circuit for use in a CMOS output buffer circuit has been disclosed. The ESD protection circuit provides a high ESD failure threshold in a small layout area to protect the output buffer against ESD failure. The output buffer includes a pull-up PMOS device and pull-down NMOS device whose common drain is connected to an output pad. The source of the PMOS device is connected to VDD and the source of NMOS device is connected to VSS. The ESD protection circuit is formed by a PTLSCR device and an NTLSCR device. The PTLSCR (NTLSCR) is formed by inserting a short-channel thin-oxide PMOS (NMOS) device into a lateral SCR structure. These MOS devices reduce the turn-on voltage of the lateral SCR to the snapback breakdown voltage of the MOS rather than the original switching voltage of the SCR. The ESD protection circuit also includes two parasitic diodes $D_p$ between output pad and VDD and $D_n$ between output pad and VSS. The four modes of ESD, PS, NS, PD and ND, are one-by-one protected by NTLSCR, Dn, Dp and PTLSCR, respectively.

14 Claims, 7 Drawing Sheets

OTHER PUBLICATIONS

R.N. Rountree, C. Duvvury, T. Maki, and H. Stiegler, "A Process–Tolerant Input Protection Circuit for Advanced CMOS Processes", *1988 EOS/ESD Symp. Proc.* EOS–10, pp. 201–205.

C. Duvvury, T. Taylor, J. Lindgren, J. Morris, and S. Kumar, "Input Protection Design for Overall Chip Reliability", *1989 EOS/ESD Symp. Proc.*, EOS–11, pp. 190–197.

G. Rieck and R. Manely, "Novel ESD Protection for Advanced CMOS Output Drivers", *1989 EOS/ESD Symp. Proc.*, EOS–11, pp. 182–189.

C. Duvvury and R. Rountree, "a Synthesis of ESD Input Protection Scheme", *1991 EOS/ESD Symp. Proc.*, EOS–13, pp. 88–97.

C.–Y. Wu, M.–D. Ker, C.–Y. Lee, and J.Ko, "A New On–Chip ESD Protection Circuit with Dual Parasitic SCR Structures for CMOS VLSI", *1992 IEEE Journal of Solid–State Circuits*, vol. 27, No. 3, pp. 274–280.

M.–D. Ker, C.–Y. Wu, and C.–Y. Lee, "A Novel CMOS ESD/EOS Protection Circuit with Full–SCR Structures", *1992 EOS/ESD Symp. Proc.*, EOS–14, pp. 258–264.

M.–D. Ker and C.–Y. Wu, "CMOS On–Chip Electrostatic Discharge Protection Circuit Using Four–SCR Structures with Low ESD–trigger Voltage", *1994 Solid–State Electronics*,vol. 37, No. 1, pp. 17–26.

A. Chatterjee and T. Polgreen, "A Low–Voltage Triggering SCR for On–Chip ESD Protection at Output and Input Pads", *IEEE Electron Device Letters*, vol. 12, No. 1, pp. 21–22, Jan. 1991.

A. Chatterjee and T. Polgreen, "A Low–Voltage Triggering SCR for On–Chip ESD Projection at Output and Input Pads", *1990 Proc. Symposium on VLSI Technology*, pp. 75–76.

C. Duvvury, R.N. Rountree, and O. Adams, "Internal Chip ESD Phenomena Beyond the Protection Circuit", *IEEE Trans. on Electron Devices*, vol. 35, No. 12, pp. 2133–2139, Dec., 1988.

X. Guggenmos and R. Holzner, "A New ESD Protection Concept for VLSI CMOS Circuits Avoiding Circuit Stress", *1991 EOS/ESD Symp. Proc.*, EOS–13, pp. 74–82.

H. Terletzki, W. Nikutta, and W. Reczek, "Influence of the Series Resistance of On–Chip Power Supply Buses on Internal Device Failure after ESD Stress", *IEEE Trans. on Electron Devices*, vol. 40, No. 11, pp. 2081–2083, Nov., 1993.

C. Johnson, T.J. Maloney, and S. Qawami, "Two Unusual HBM ESD Failure Mechanisms on a Mature CMOS Process", *1993 EOS/ESD Symp. Proc.*, EOS–15, pp. 225–231.

C. Duvvury, R. A. McPhee, D. A. Baglee, and R. N. Rountree, "ESD Protection Reliability in 1–µm CMOS Technologies", *1986 IRPS Proc.*, pp. 199–205.

S. Daniel and G. Krieger, "Process and Design Optimization for Advanced CMOS I/O ESD Protection Devices", *1900 EOS/ESD Symp. Proc.*, EOS–12, pp. 206–213.

Y. Wei, Y. Loh, C. Wang, and C. Hu, "MOSFET Drain Engineering for ESD Performance", *1992 EOS/ESD Symp. Proc.*, EOS–14 pp. 143–148.

T.L. Polgreen and A. Chatterjee, "Improving the ESD Failure Threshold of Silicided n–MOS Output Transistors by Ensuring Uniform Current Flow", *1992 IEEE Trans. Electron Devices*, vol. 39, No. 2, pp. 379–388.

C. Duvvury, C. Diaz, and T. Haddock, "Achieving Uniform nMOS Device Power Distribution for Submicron ESD Reliability", *1992 IEDM Technical Digest*, pp. 131–134.

C. Duvvury, and C. Diaz, "Dynamic Gate Coupling of NMOS for Efficient Output ESD Protection", *1992 Proc. of IRPS*, pp. 141–150.

Baker, R. Currence, S. Law, M. Le, C. Lee, S.T. Lin & M. Teene, "A Waffle Layout Technique Strengthens the ESD Hardness of the NMOS Output Transistor", 1989 EOS/ESD Symp. Proc. EOS–11, pp. 175–181.

Y.–S. Hu, H.–R. Liauh, and M.–C. Chang, "High Density Input Protection Circuit Design In 1.2µm CMOS Technology", *1987 EOS/ESD Symp. Proc.*, EOS–9, pp. 179–185.

S.R. Vemura, "Layout Comparison of MOSFETs With Large W/L Ratios" *1992 Electronics Letters*, vol. 28 No. 25, pp. 2327–2329.

CMOS OUTPUT BUFFER WITH ENHANCED HIGH ESD PROTECTION CAPABILITY

RELATED APPLICATIONS

The following patent applications are assigned to the assignee hereof and contain subject matter related to the subject matter of the present patent application:

1. U.S. patent application Ser. No. 08/419650 now U.S. Pat. No. 5,572,394, entitled "CMOS On-Chip Four-LVTSCR ESD Protection Scheme", filed on even date herewith for Ming-Dou KER and Tain-Shun WU.
2. U.S. patent application Ser. No. 08/419638 now U.S. Pat. No. 5,637,900, entitled "Latchup-Free Fully Protected CMOS On-Chip ESD Protection Circuit", filed on even date herewith for Ming-Dou KER and Tain-Shun WU, and
3. U.S. patent application Ser. No. 08/419637, entitled "N-Sided Polygonal Cell Layout For Multiple Cell Transistor", filed on even date herewith for Ming-Dou KER, Tain-Shun WU and Kuo-Feng WANG. The contents of the above-listed patent applications are incorporated herein by reference.

FIELD OF THE INVENTION

The present invention relates to a CMOS output buffer circuit with enhanced ESD (Electro Static Discharge) protection capability.

BACKGROUND OF THE INVENTION

Submicron CMOS IC's often suffer from a lack of robustness with respect to ESD. As CMOS technology is scaled down into the submicron regime, various structures and processes, such as thinner gate oxide, shorter channel length, shallower source/drain junction, LDD (Lightly Doped Drain) structures, and silicided diffusion, degrade the ESD robustness of CMOS IC's. (see e.g. C. Duvvury and A. Amerasekera, "ESD: A pervasive reliability concern for IC technologies," in *Proc. of IEEE*, vol. 81, no. 5, pp. 690–702, May 1993; and A. Amerasekera and C. Duvvury, "The impact of technology scaling on ESD robustness and protection circuit design," 1994 *EOS/ESD Symp. Proc.*, EOS-16, pp. 237–245).

In particular, the drains of NMOS and PMOS devices in a CMOS output buffer of an IC are often directly connected to an output pad to drive an external load. Thus, when implemented in submicron technology, a CMOS output buffer is weak with respect to ESD stress. To improve the ESD protection capability of a CMOS output buffer and also to provide enough current driving/sinking capability to/from an external load, the NMOS and PMOS devices in the output buffer have relatively large device dimensions. However, even with the relatively large device dimensions, when submicron CMOS technology is used, the ESD protection capability of the output buffer is reduced (see e.g. T. L. Polgreen and A. Chatterjee, "Improving the ESD failure threshold of silicided nMOS output transistors by ensuring uniform current flow," *IEEE Trans. Electron Devices*, Vol. 39, No. 2, pp. 379–388, 1992; C. Duvvury, C. Diaz, and T. Haddock, "Achieving uniform NMOS device power distribution for submicron ESD reliability," in 1992 *IEDM Technical Digest*, pp. 131–134; and C. Duvvury, and C. Diaz, "Dynamic gate coupling of NMOS for efficient output ESD protection," in *Proc. of IRPS*, pp. 141–150, 1992.).

To improve the ESD robustness of a submicron CMOS output buffer, some submicron CMOS technologies offer an additional "ESD Implant" mask into processes to make a stronger device structure for a CMOS output buffer to protect against ESD damage. However, this results in increased IC fabrication costs.

Another approach to ESD protection in a CMOS output buffer is to provide one or more ESD protection elements between the CMOS output buffer and the output pad to improve the robustness of a submicron CMOS output buffer with respect to ESD.

In Y.-J. B. Liu and S. Cagnina, "Electrostatic discharge protection device for CMOS integrated circuit outputs," U.S. Pat. No. 4,734,752, 1988, a field-oxide (N-type) device is placed in parallel with the thin-oxide NMOS device of the CMOS output buffer from the output pad to VSS (ground) to improve the ESD protection capability of the CMOS output buffer. In T. C. Chan and D. S. Culver, "ESD protection circuit," U.S. Pat. No. 5,329,143, 1994, a lateral N-P-N bipolar transistor is placed in parallel with the thin-oxide NMOS device of the CMOS output buffer from the output pad to ground to improve the ESD protection capability of the CMOS output buffer. But the turn-on voltages of a parasitic field-oxide device and parasitic lateral N-P-N bipolar transistor are generally higher than that of a short-channel thin-oxide NMOS device in the submicron CMOS output buffer. Thus, the thin-oxide NMOS device will be first turned on when the ESD stress occurs on this output pad. Thus, the improvement of ESD protection by adding the field-oxide device or lateral N-P-N bipolar transistor may be small. In Scott et al., U.S. Pat. No. 5,019,888, 1991, the large-dimension output thin-oxide NMOS device is separated into many small dimension NMOS devices in parallel with each other from the output pad to ground.

There is a series resistance inserted from the drain of each small-dimension NMOS device to the output pad to improve its ESD robustness. In G.N. Roberts, "Output ESD protection circuit," U.S. Pat. No. 5,218,222, 1993, a lateral N-P-N bipolar transistor is placed in parallel with the output NMOS device from the output node of the output buffer to ground, and a series resistance is inserted between the output pad and the output node of the output buffer, to improve ESD reliability of the output pad. In K. F. Lee, A. Lee, M. L. Marmet, and K. W. Ouyang, "Electro-static discharge protection circuit with bimodal resistance characteristics," U.S. Pat. No. 5,270,565, 1993, a thick-oxide device is placed in parallel with the thin-oxide NMOS device in the CMOS output buffer from the output pad to VSS and the drain of the thin-oxide NMOS device in the CMOS output buffer is modified with a series N-well resistor to the output pad, to improve ESD protection capability of the CMOS output buffer. In Scott et al., U.S. Pat. No. 5,019,888, 1991; G. N. Roberts, "Output ESD protection circuit," U.S. Pat. No. 5,218,222, 1993; and K. F. Lee, A. Lee, M. L. Marmet, and K. W. Ouyang, "Electro-static discharge protection circuit with bimodal resistance characteristics," U.S. Pat. No. 5,270,565, 1993, there are series resistors from the output node of the CMOS output buffer to the output pad. These series resistors could effectively improve ESD robustness of a submicron CMOS output buffer, but they limit the current driving/sinking capability of the CMOS output buffer. The timing for the output signal is also delayed by the series resistors. Thus, the output signal is also delayed by the series resistors. Thus, the output driving/sinking capability and output timing may become outside of the design specifications. This limits the usefulness of an output buffer modified in this way for application in high-speed (minimum delay for input/output signal) and heavy-loading (output buffer of high-driving/sinking capability) CMOS IC's.

To improve ESD protection of submicron CMOS IC's, the lateral SCR device was also used as an ESD protection element. The lateral SCR was found to perform the highest ESD protection capability in a smallest layout area (compared with other ESD protection elements such as diode, thick-oxide device, gate-oxide device, and parasitic bipolar device in submicron CMOS IC's). In A. Chatterjee and T. Polgreen, "A low-voltage triggering SCR for on-chip ESD protection at output and input pads," *IEEE Electron Device Letters*, vol. 12, no. 1, pp. 21–22, January 1991; and A. Chatterjee and T. Polgreen, "A low-voltage triggering SCR for on-chip ESD protection at output and input pads," in 1990 *Proc. Symposium on VLSI Technology*, pp. 75–76, a modified structure of lateral SCR device called an LVTSCR (Low-Voltage Trigger SCR) was reported to effectively protect the output NMOS device in submicron CMOS IC's. The LVTSCR device is in parallel with the output NMOS from the output pad to ground. The LVTSCR device is made by inserting a short-channel NMOS device into the lateral SCR device to lower its trigger voltage. As a high voltage occurs at the output pad, this high voltage is diverted to the drain of the short-channel NMOS device in the LVTSCR device and leads to snapback breakdown on the short-channel NMOS device. This snapback-breakdown short-channel NMOS device leads to self-regeneration turn-on action in the LVTSCR device. After turn-on action, the LVTSCR is held at its low-impedance state to bypass ESD current. The LVTSCR device performs ESD protection for an output NMOS device without adding any series resistor between output buffer and output pad.

Since ESD voltages may have positive or negative polarities on a pin with respect to both VDD (high supply voltage) and VSS (low supply voltage or ground) pins, there are four different ESD-stress cases at an output pad of a CMOS output buffer:

(1) PS mode: ESD stress at an output pin with positive voltage polarity to VSS bus when VDD bus is floating;
(2) NS mode: ESD stress at an output pin with negative voltage polarity to VSS bus when VDD bus is floating;
(3) PD mode: ESD stress at an output pin with positive voltage polarity to VDD bus when VSS bus is floating;
(4) ND mode: ESD stress at an output pin with negative voltage polarity to VDD bus when VSS bus is floating.

These ESD voltages could damage both NMOS and PMOS devices in the output buffer of CMOS IC's.

The ESD failure threshold voltage of a pin is defined as the lowest ESD-sustaining voltage of the four-mode ESD stresses on the pin. For example, if an output pin can sustain up to 6 KV ESD voltage in PS-, NS-, and PD-mode ESD stresses but it can only sustain 1 KV ESD voltage in the ND-mode ESD stress, the ESD failure threshold voltage for this output pin is defined as 1 KV only. In the references cited above, the ESD protection is emphasized from the output pad to VSS (ground). The additional ESD protection elements are all placed from the output pad to ground in parallel with an output NMOS device. There is no additional ESD protection element arranged between the output pad and VDD. For ND-mode or PD-mode ESD stresses, the PMOS device of the CMOS output buffer (or the output device between VDD and output pad) is sensitive to ESD damage. The overall ESD failure threshold voltage may be not effectively improved. Thus, an effective ESD protection circuit for output buffer of advanced submicron CMOS IC's should provide strong ESD discharging paths from the output pad to both VSS and VDD buses.

In view of the foregoing, it is an object of the present invention to provide a CMOS output buffer which overcomes the shortcoming of the above-described prior art CMOS output buffers with respect to ESD protection.

It is also an object of the present invention to provide a CMOS output buffer which incorporates a pair of low-voltage trigger SCR devices as well as a pair of parasitic diodes, to provide ESD protection.

It is also an object of the present invention to provide a CMOS output buffer which protects against four modes (PS, NS, PD, and ND) of ESD stress.

It is a further object of the invention to provide a CMOS buffer with ESD protection that has a higher threshold for ESD failure and a smaller layout area than conventional CMOS output buffers with ESD protection.

SUMMARY OF THE INVENTION

The present invention is directed to a CMOS output buffer circuit which is robust with respect to ESD protection.

In a preferred embodiment, the inventive buffer comprises a pull-up thin-oxide PMOS device and a pull-down thin-oxide NMOS device. The source of the PMOS device is connected to VDD (upper voltage supply). The source of the NMOS device is connected to VSS (lower supply voltage or ground). The drains of the PMOS and NMOS devices are connected together to form an output node of the output buffer circuit, which output node is connected via a protected line to an output pad. An input signal of the output buffer is applied via a pre-buffer to the gates of the pull-up PMOS device and pull-down NMOS device.

To provide ESD protection, two parasitic diodes and two low voltage trigger SCR devices are utilized. A first parasitic diode DP is connected in parallel with the PMOS device with its anode connected to the output pad and its cathode connected to VDD. The $D_p$ diode is used to protect against PD mode ESD stress. A second parasitic diode $D_n$ is connected in parallel to the NMOS device with its anode connected to VSS and its cathode connected to the output pad. The diode $D_n$ protects against NS mode ESD stress.

The first low voltage trigger SCR device is a PMOS Trigger Lateral SCR (PTLSCR). The PTLSCR is arranged in parallel with the PMOS device between the output pad and VDD. The PTLSCR device is used to protect against ND mode ESD stress. The second low voltage trigger SCR device is a NMOS Trigger Lateral SCR (NTLSCR). The NTLSCR is arranged in parallel between the output pad and VSS and is used to protect against PS mode ESD.

Thus, the parasitic diodes $D_p$ and $D_n$ and the PTLSCR and NTLSCR protect against all four modes of ESD.

The PTLSCR device is formed by inserting a short-channel thin-oxide PMOS device into a lateral SCR structure. The NTLSCR device is formed by inserting a short-channel thin-oxide NMOS device into a lateral SCR. These short-channel thin-oxide PMOS and NMOS devices are used to trigger on the lateral SCR structures by drain snapback breakdown during ESD stress. Thus, the trigger voltages of the PTLSCR and NTLSCR are lowered to the drain snapback breakdown voltages of the short-channel thin-oxide PMOS and NMOS devices incorporated therein rather than the original switching voltages of the lateral SCR.

The output buffer of the present invention can be realized in any CMOS or BiCMOS technology with N-well/P-substrate, P-well/N-substrate or twin well processes. The invention is fully process compatible to CMOS and BiCMOS technologies.

Although two additional devices (PTLSCR and NTLSCR) are incorporated in the inventive output buffer, the inventive output buffer provides a higher ESD failure threshold with a smaller layout area than conventional ESD devices.

DETAILED DESCRIPTION OF THE INVENTION

A. Circuit Configuration

Figure 1:
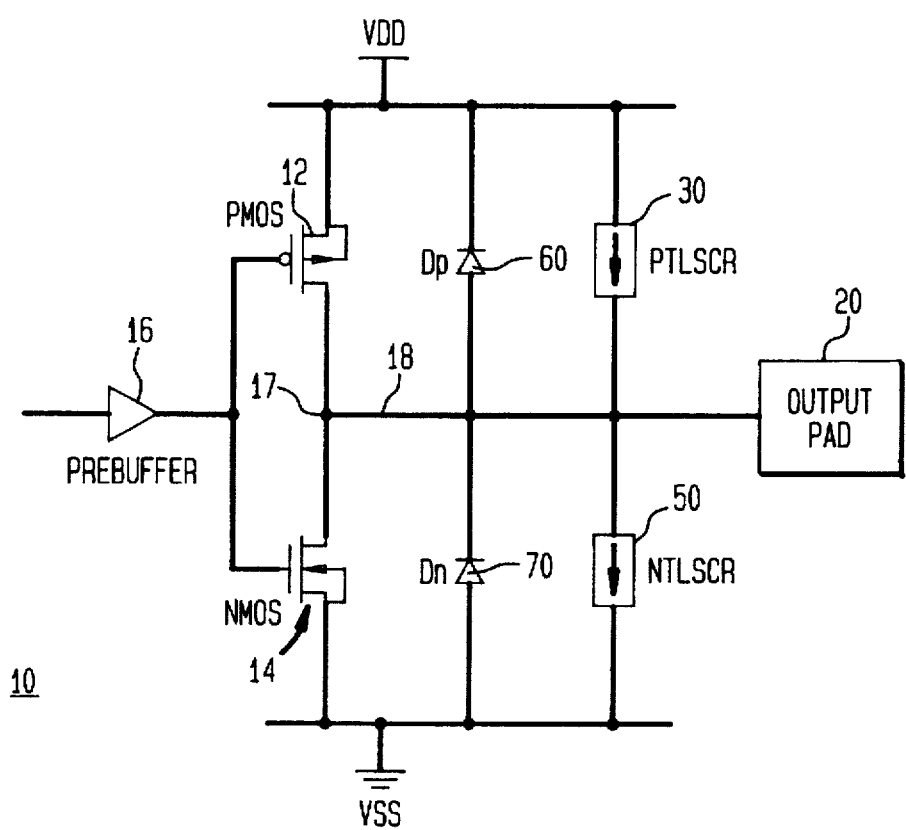
FIG. 1 schematically illustrates an output buffer for a CMOS IC with enhanced ESD protection in accordance with an illustrative embodiment of the invention.

FIG. 1 schematically illustrates a CMOS output buffer 10 with enhanced ESD protection in accordance with an illustrative embodiment of the present invention.

The output buffer comprises a pull-up thin-oxide PMOS device 12 whose source is connected to VDD and a pull-down NMOS device 14 whose source is connected to VSS. The drains of the PMOS and NMOS devices 12 and 14 are connected to each other to form an output node 17 of the output buffer 10. The output node 17 is connected via a line 18 (the protected line) to an output pad 20.

To provide ESD protection, a PTLSCR device 30 is connected in parallel with the thin-oxide PMOS device 12 from VDD to the protected line 18. An NTLSCR device 50 is connected in parallel with the thin-oxide NMOS device 14 from the protected line 18 to VSS.

The CMOS output buffer 10 also comprises two parasitic diodes. A $D_p$ diode 60 is in parallel with the PMOS device 12 with its anode connected to the protected line 18. A $D_n$ diode 70 is connected in parallel with the NMOS device 14 with its anode connected to VSS.

The PTLSCR device is arranged to bypass ND-mode ESD stress. The $D_p$ diode 60 to is used to bypass the PD-mode ESD stress. The NTLSCR device is arranged to bypass the PS-mode ESD stress. The parasitic $D_n$ diode 70 is used to bypass NS-mode ESD stress. The four modes of ESD stresses on the output pad 20 are one-by-one protected by the PTLSCR, NTLSCR, $D_p$ and $D_n$ devices which can offer efficient and direct ESD discharging paths to quickly bypass ESD currents.

The trigger voltage of PTLSCR (NTLSCR) is equivalent to the snapback breakdown voltage of the short-channel PMOS (NMOS) devices incorporated therein rather than the original switching voltage of the lateral SCR device. The snapback breakdown voltage of the short-channel thin oxide PMOS (NMOS) incorporated in the PTLSCR (NTLSCR) depends on the particular CMOS technology used. However, this snapback breakdown voltage is lower than the gate-oxide breakdown voltage in the same CMOS technology. The snapback breakdown voltage of thin oxide NMOS and PMOS devices is also dependent on their channel lengths. A shorter channel length leads to lower snapback breakdown voltage on the thin-oxide NMOS and PMOS devices.

To protect the drains of the thin-oxide PMOS and NMOS device 12 and 14 in the CMOS output buffer 10, the channel length of the PMOS and NMOS devices in the PTLSCR and NTLSCR should be shorter than the channel length in the PMOS and NMOS devices 12 and 14. Thus, the trigger voltage of the PTLSCR (NTLSCR) is lower than the breakdown voltage of PMOS12 (NMOS14).

As ND-mode (PS-mode) ESD events occur on the output pad 20, PTLSCR (NTLSCR) will be turned on first without PMOS12 (NMOS14) being broken down by the ESD voltage. Thus, the PTLSCR and NTLSCR devices protect the CMOS output buffer from ESD damage without adding extra series resistance as was done in the prior art discussed above.

B. Device Structure

Figure 2:
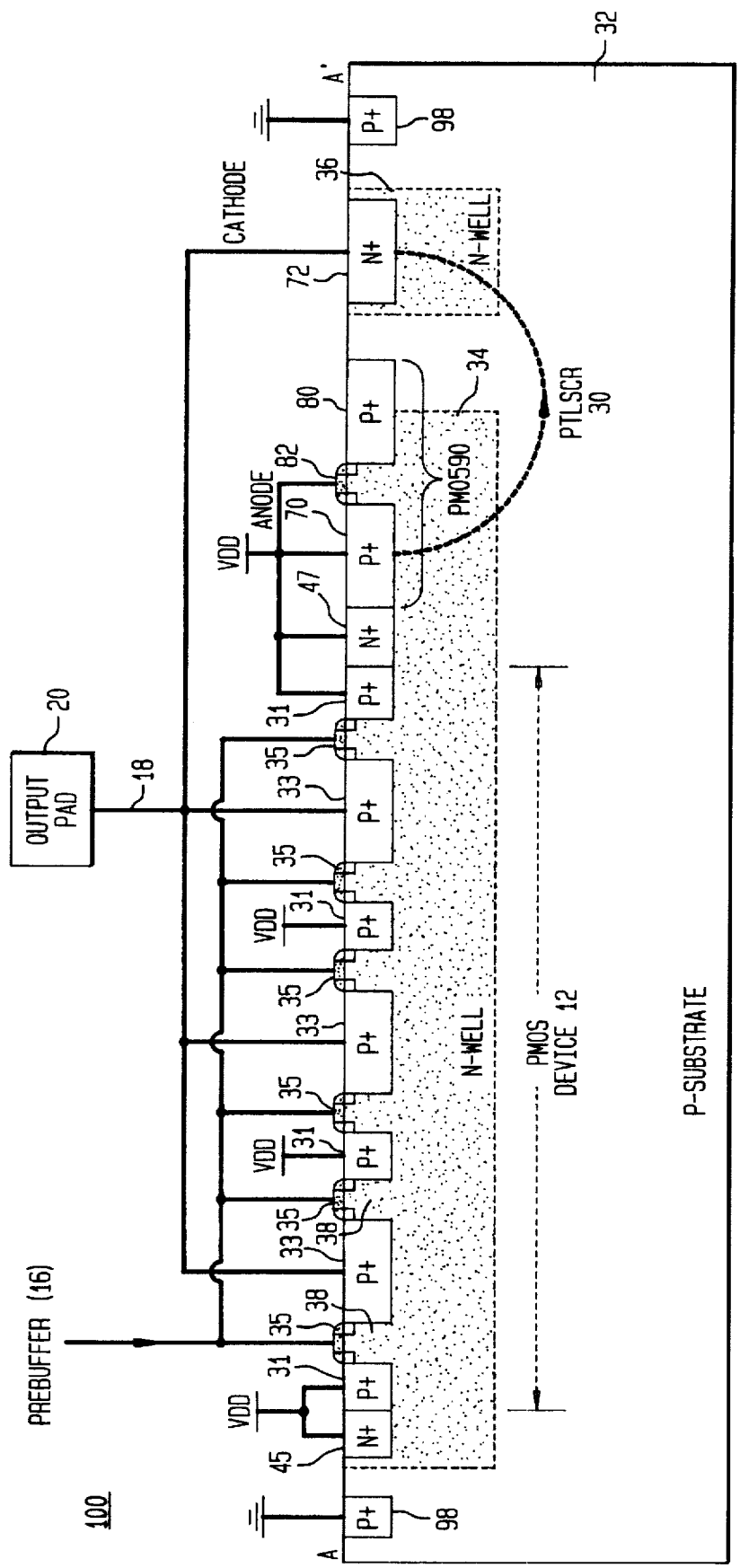
FIG. 2 illustrates a PTLSCR device in accordance with the invention using an N-well/P-substrate structure.

FIG. 2 schematically illustrates a cross section of the PMOS 12 and PTLSCR device 30 of FIG. 1. In FIG. 2, the PTLSCR device 30 is formed integrally with the output PMOS device 12 to save layout area. In FIG. 2, the PTLSCR device 30 and PMOS device 12 are formed in an N-well/P-substrate structure.

As shown in FIG. 2, a semiconductor structure 100 comprises a P-type substrate 32. The substrate 32 is formed from silicon and is doped with Boron to yield a P-type semiconductor. A pair of N-wells 34 and 36 are formed by diffusion in the substrate 32. The N-wells, formed by diffusion, are doped with Phosphorus or Arsenic to yield an N-type semiconductor. The PMOS device 12 is formed by the diffused $P^+$ regions 31 and 33. The $P^+$ regions 31 and 33 are formed by diffusion. The regions 31 form the source of the PMOS device 12 and are connected to VDD. The regions 33 form the drain of the PMOS device 12 and are connected to the output pad 20 via the protected line 18. The thin oxide gates 35 of the PMOS device 12 receive an input signal from the prebuffer 16 (see FIG. 1). The width of the channels 38 between the source and drain regions 31 and 33 is about 1 micron.

The $N^+$ diffusion contact regions 45 and 47 are connected to VDD. These regions 45 and 47 provide well contact for the PMOS device 12. These regions 45 and 47 are connected to VDD to provide a voltage bias for the bulk of the PMOS device 12. The parasitic diode $D_p$ 60 is formed between the N-well 34 and the $P^+$ drain regions 33. A guard ring is formed by the $P^+$ region 98. This region 98 is connected to VSS.

The PTLSCR device 30 is arranged between VDD and the output pad 20. The PTLSCR device 30 is formed by a lateral SCR which comprises the $P^+$ diffusion region 70, the N-well 34, the P-substrate 32 and the N-well 36 which contains the $N^+$ diffusion contact region 72. Combined with the lateral SCR is a thin-oxide short channel PMOS device 90. The PMOS device 90 comprises the $P^+$ regions 70 (source) and 80 (drain) and the thin-oxide gate 82 which is connected to VDD. The source region 70 is also connected VDD. The drain region 80 is a non-connected $P^+$ region formed across the N-well 34/P substrate 32 junction.

The purpose of inserting the short-channel thin-oxide PMOS device 90 into the lateral SCR structure is to use the drain 80 of the thin-oxide PMOS 90 in its snap-back breakdown condition to trigger on the lateral SCR structure during ND-mode ESD stress. Thus, the trigger voltage of the PTLSCR device 30 is equivalent to the snap-back breakdown voltage of the short-channel thin-oxide PMOS 90 rather than the original switching voltage (30–50 volts) of the lateral SCR device. After being turned on, the holding voltage of the PTLSCR 30 is the same as the original holding voltage of the lateral SCR (about 1V) with very low turn-on resistance (2–5 ohms). The gate 82 of the PMOS 90 is connected to VDD to ensure that PMOS 90 is off during normal IC operating conditions.

Figure 3:
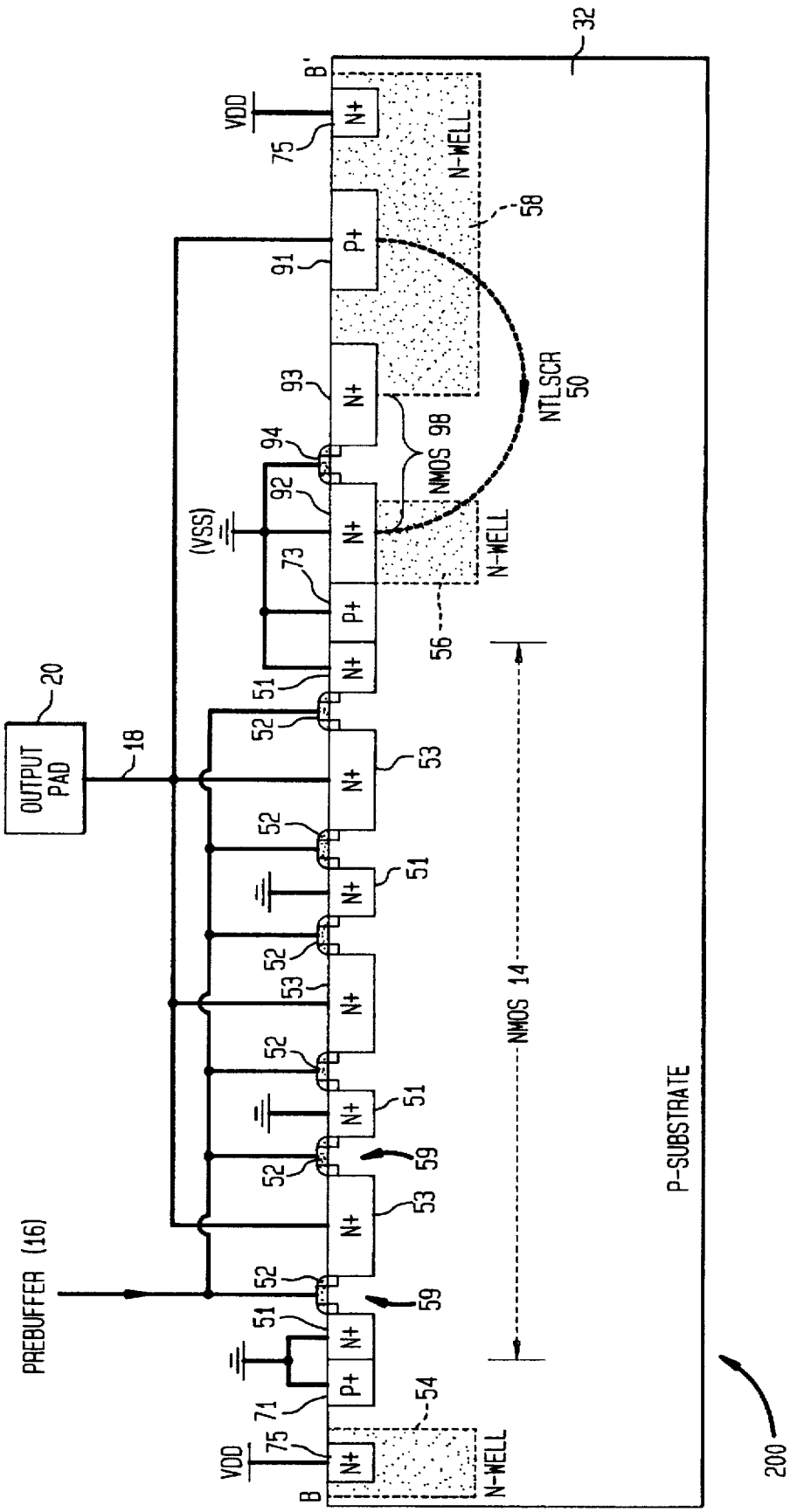
FIG. 3 illustrates an NTLSCR device in accordance with the invention using an N-well/P-substrate structure.

FIG. 3 schematically illustrates a cross section of the NMOS 14 and NTLSCR device 50 of FIG. 1. In FIG. 3, the NTLSCR device 50 is formed integrally with the NMOS device 14 to save layout area. In FIG. 3, the NTLSCR device 50 and NMOS device 14 are formed in an N-well/P-substrate structure.

As shown in FIG. 3, a semiconductor structure 200 comprises a substrate 32. (In practice, the structure 100 of FIG. 2 and the structure 200 of FIG. 3 are formed as part of the same integrated circuit on the substrate 32.) The structure 200 comprises the N-wells 54, 56, 58. These wells 54, 56, 58 are N-type wells in the P-type substrate 32. The NMOS device 14 comprises the $N^+$ type source regions 51 and the $N^+$ type drain regions 53. The drain regions 53 are connected to the output pad 20 via the protected line 18. The source regions 51 are connected to VSS. The channel regions 59 between the sources 51 and drains 53 have a width of 1 micron. A thin oxide gate 52 is formed over each channel 54. The gates 52 receive an input signal from the prebuffer 16 (see FIG. 1). The $P^+$ regions 71 and 73 provide substrate contact for the NMOS device 14. These regions are connected to VSS to provide a voltage bias for the bulk of the NMOS device 14.

The parasitic diode $D_n$ (70 in FIG. 1) is formed by the $N^+$ drain regions 53 and the P-substrate 32 which is connected to VSS via the $P^+$ regions 71 and 73.

The $N^+$ regions 75 in the N-wells 54, 58 form a guard ring.

The NTLSCR device 50 is arranged between the output pad 20 and VSS with its anode connected to the output pad and its cathode connected to VSS. The NTLSCR device 50 is formed by a lateral SCR device with a short-channel thin-oxide NMOS device 98 which are merged together to lower the trigger voltage of the lateral SCR device.

The lateral SCR device is formed by the $P^+$ region 91 which is connected to the output pad, the N-well 58, the P-substrate 32, and the N-well 56 which is connected to VSS by the $N^+$ diffusion region 92.

The NMOS device 98 is formed by the $N^+$ region 92 as its source, which source is connected to VSS. The $N^+$ region 92 crosses the junction of the N-well 56 and P-substrate 32.

The drain is formed by the non-connected $N^+$ region 93 which crosses the junction between the N-well 58 and the substrate 32. The channel between the source 92 and drain 93 has a width of 0.8 microns. The NMOS device 98 has a thin oxide gate 94 which is connected to VSS.

The purpose of inserting a short-channel thin-oxide NMOS 98 device into the lateral SCR structure is to use the drain 93 of the NMOS device 98 in its snap-back breakdown condition to trigger on the lateral SCR structure during the PS-mode ESD discharge. The trigger voltage of the NTLSCR device 50 is now equivalent to the snap-back breakdown voltage of the NMOS device 98 rather than the original turn-on voltage of the lateral SCR (30–50 volts). After turn-on, the holding voltage of the NTLSCR is the same as the holding voltage of the original lateral SCR (1V) and the turn-on resistance for bypassing ESD current is very low (e.g. 2–5 ohms).

Figure 4:
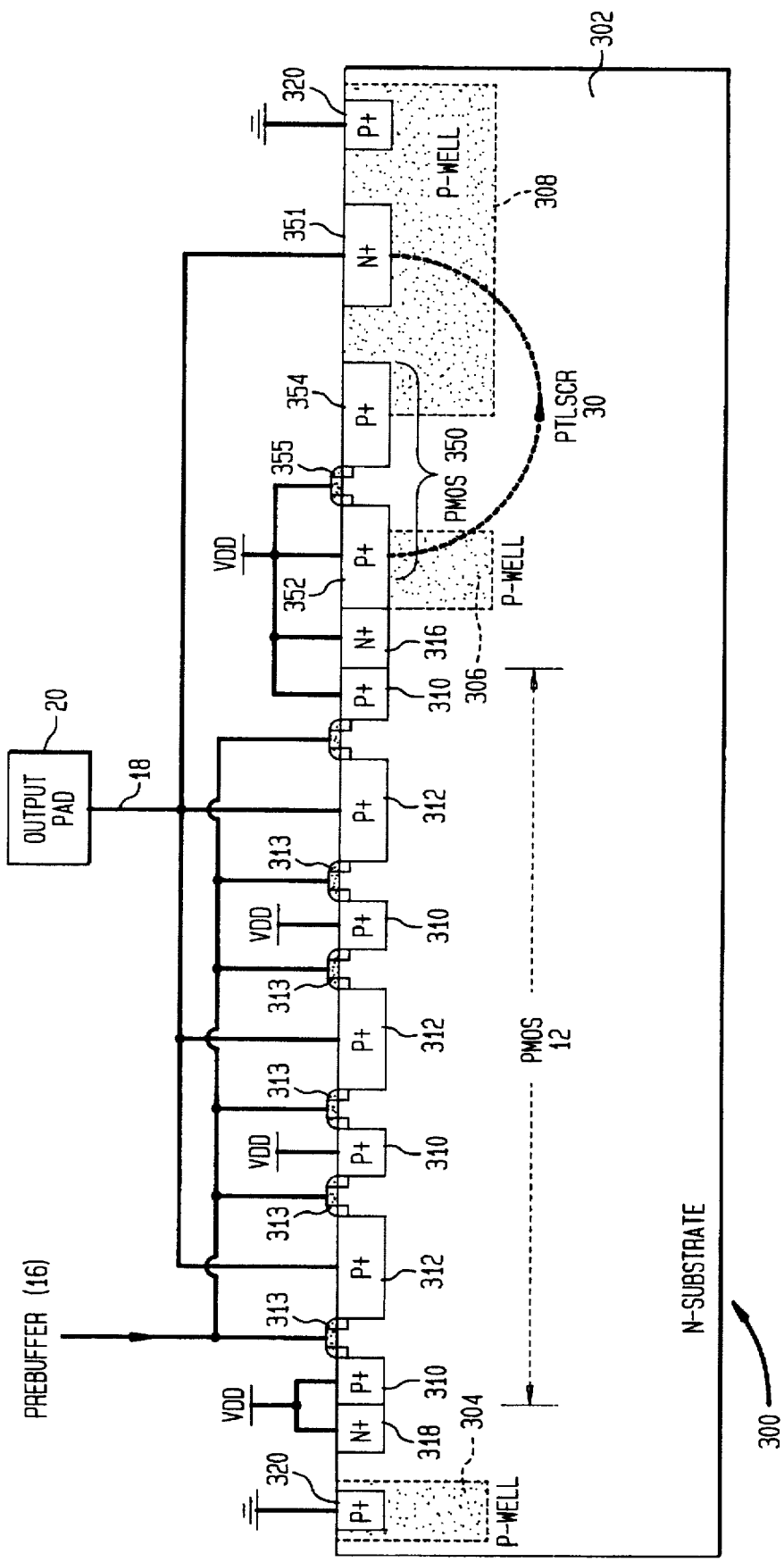
FIG. 4 illustrates an PTLSCR device in accordance with the invention using a P-well/N-substrate structure.
Figure 5:
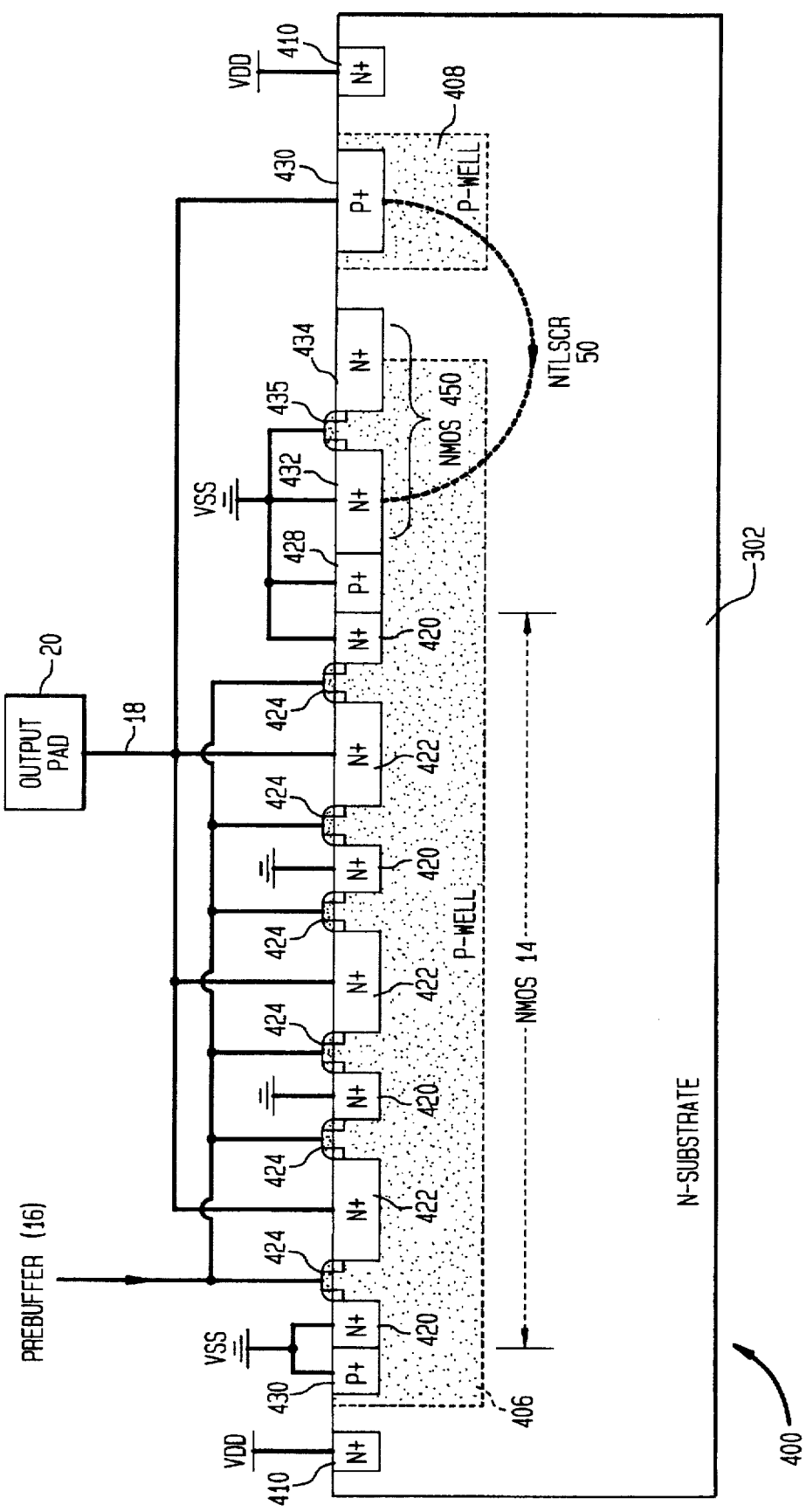
FIG. 5 illustrates an NTLSCR device in accordance with the invention using an P-well/N-substrate structure.

FIGS. 2 and 3 illustrate the PTLSCR and NTLSCR devices formed using N-well/P-substrate structures. FIGS. 4 and 5 illustrate the formation of the PTLSCR and NTLSCR devices in a P-well/N-substrate structure. The PTLSCR device is shown in FIG. 4 and the NTLSCR device is shown in FIG. 5.

FIG. 4 shows a structure 300 which comprises an N-substrate 302 and a plurality of P-wells 304, 306, 308. The structure 300 shows how the PMOS device 12 (see FIG. 1) is integrated with the PTLSCR 30. The PMOS device 12 comprises a plurality of $P^+$ source regions 310 connected to VDD and a plurality of $P^+$ drain regions 312 connected via the protected line 18 to the output pad 20. The gates 313 are connected to the pre-buffer 16. The $N^+$ regions 316, 318, which are connected to VDD, provide bias for the substrate of the PMOS device 14. The $P^+$ type regions 320 form a guard ring for the PMOS device 12 and PTLSCR 30. The parasitic diode $D_p$ is formed by the $P^+$ drain regions 312 and the N-substrate 302 which is held at VDD by way of the $N^+$ regions 318, 316.

The PTLSCR device 30 is a lateral SCR which incorporates a short channel thin-oxide PMOS device 350 to lower the SCR trigger voltage to the snap-back breakdown voltage of the PMOS device 350. The lateral SCR includes P-well 306 (including $P^+$ region 352) which is connected to VDD, N-substrate 302 which is connected to VDD, and $N^+$ type region 351 (in the P-well 308) which is connected to the output pad 20. The P-well 308 is connected to VSS through the $P^+$ diffusion region 320. The PMOS device 350 includes $P^+$ type regions 352, 354 as source and drain and the gate 355. The source and gate are connected to VDD and the drain is non-connected. The $P^+$ source region 352 crosses the junction between the P-well 306 and N-substrate 302. The $P^+$ drain region 354 crosses the junction between the P-well 308 and substrate 302.

FIG. 5 shows a semiconductor structure 400 which incorporates the NMOS device 14 and the NTLSCR 50. The semiconductor structure 300 of FIG. 4 incorporating PMOS device 12 and PTLSCR 30 and the semiconductor structure 400 of FIG. 5 are in practice formed as part of a single integrated circuit in the substrate 302.

In FIG. 5, the substrate 302 includes two P-wells 406 and 408. The NMOS device 14 and NTLSCR 50 are surrounded by an $N^+$ type guard ring 410 which is connected to VDD. The NMOS device 14 comprises the source regions 420 which are connected to VSS, the drain regions 422 which are connected via the protected line 18 to the output pad 20, and the thin-oxide gates 424 which receive an input signal from the pre-buffer 16. The $P^+$ regions 428, 430, which are connected to VSS, provide a voltage bias for the P-well 406 of the NMOS device 14.

The NTLSCR 50 comprises a lateral SCR in combination with a short-channel thin-oxide NMOS device 450. The lateral SCR comprises the P-well 408 including the5 $P^+$ region 430 which is connected to the output pad 20, the N-substrate 302 which is connected to VDD through the guard rings 410, the P-well 406 and the $N^+$ region 432 which are connected to VSS. The NMOS device 450 comprises the $N^+$ regions 434 (drain) and 432 (source), and the thin-oxide gate 435. The source 432 and gate 435 are connected to VSS. The drain 434 is non-connected. The drain 434 crosses the junction between the P-well 406 and the N-substrate 302. The purpose of the NMOS device 450 is to reduce the turn-on voltage of the lateral SCR down to the snap-back voltage of the NMOS device 450.

C. Layout Examples

Figure 6:
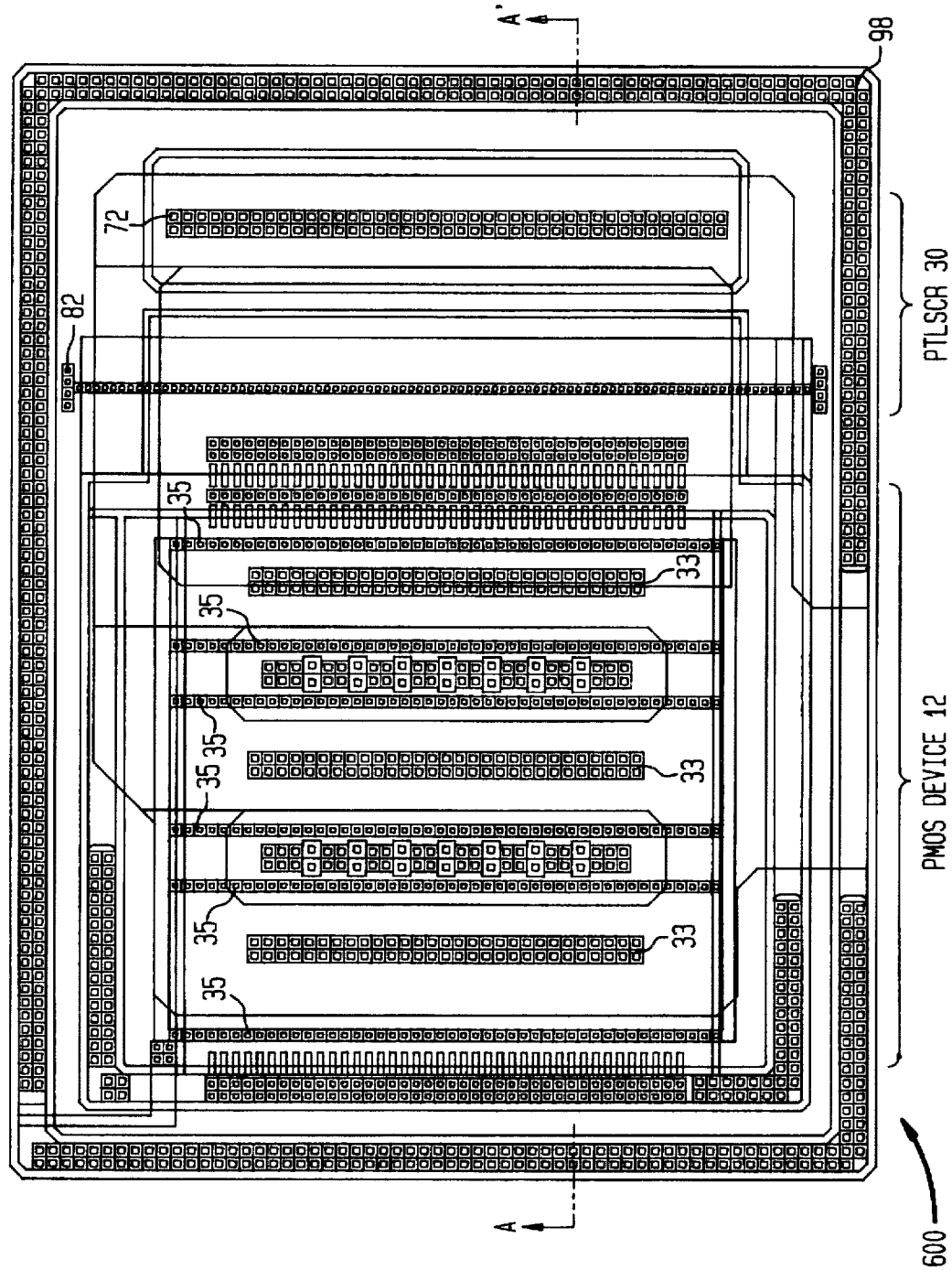
FIG. 6 illustrates a pattern layout in accordance with the invention showing a top view of the structure shown in FIG. 2, which is the cross sectional view along the line A-A'.

A preferred layout 600 of the structure 100 of FIG. 2 is illustrated in FIG. 6. This preferred layout 600 provides a compact layout style. FIG. 6 shows a plan view of the structure 100 of FIG. 1 which is the cross sectional view along the line A–A'. As in FIG. 2, FIG. 6 shows the PMOS device 12 merged together with the PTLSCR 30 and surrounded by the latchup guard ring 98. FIG. 6 shows the thin-oxide PMOS device with three fingers of drain 33 which are parallel to each other. The PTLSCR device 30 is adjacent to the thin-oxide PMOS device 12 and is parallel thereto. The entire structure 100 of FIG. 2 is formed as part of a single integrated circuit. That is, in this layout 600, all the elements of the structure 100 including the latchup prevention guard ring 98 are merged together to effectively reduce the layout area.

Figure 7:
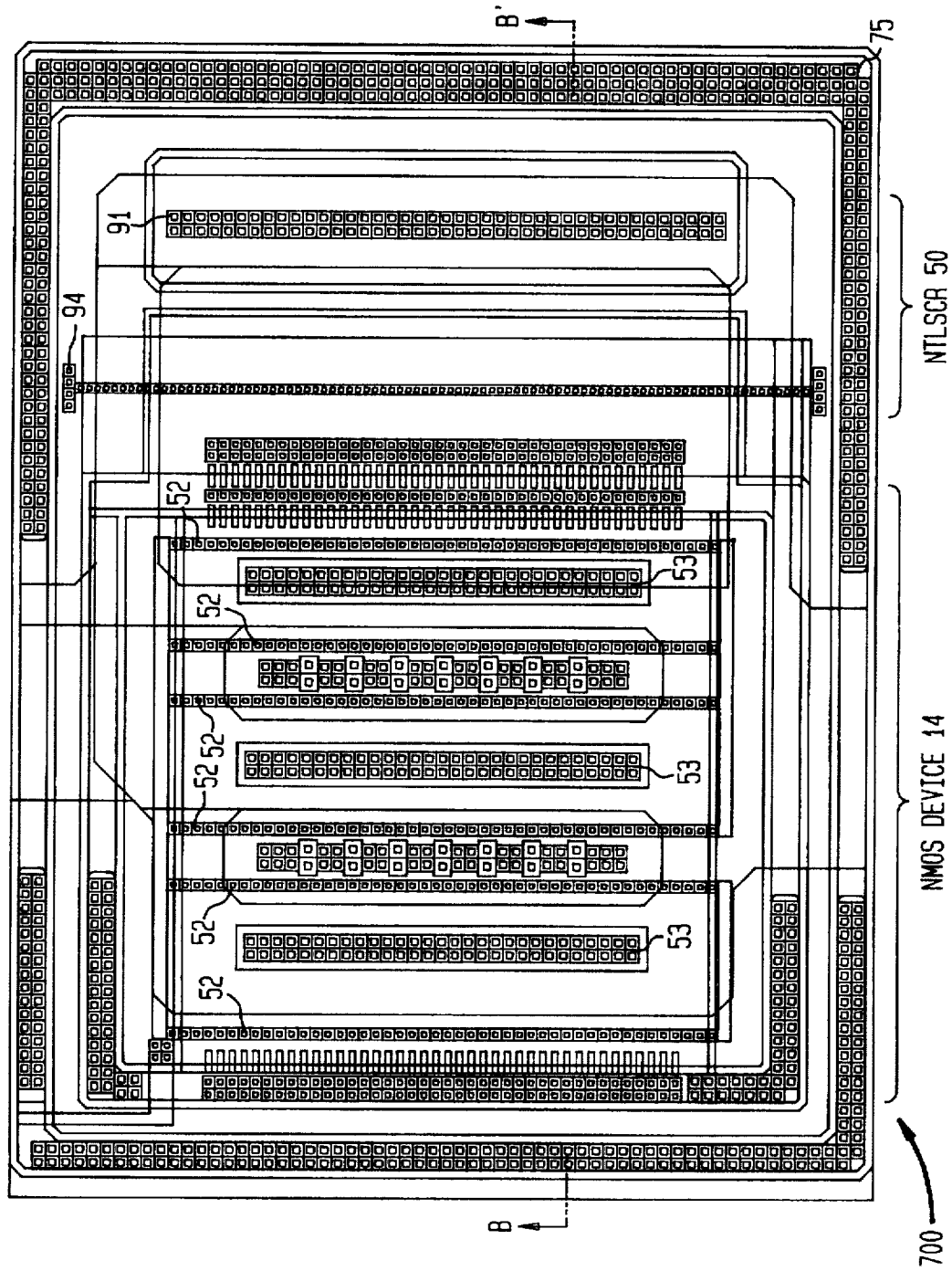
FIG. 7 illustrates a pattern layout in accordance with the invention showing a top view of the structure shown in FIG. 3, which is the cross sectional view along the line B-B'.

A preferred layout 700 of the structure 200 of FIG. 3 is illustrated in FIG. 7, which shows a plan view of the structure 200. The structure 200 of FIG. 3 is a cross sectional view along the line B–B' of the layout 700 shown in FIG. 7. This preferred layout 700 provides a compact layout style. The layout 700 shows the NMOS device 14 merged together with the NTLSCR 50 and surrounded by the latchup guard ring 75. FIG. 7 shows the thin-oxide NMOS device 14 with three fingers of drain 53 which are parallel to each other. The NTLSCR device 50 is adjacent to the thin-oxide NMOS device 14 and is parallel thereto. The entire structure 200 of FIG. 3 is formed as part of a single integrated circuit. That is, in this layout 700, all the elements of the structure 200 including the latchup prevention guard ring 75 are merged together to effectively reduce the layout area.

The preferred layouts for the P-well/N-substrate structures 300 and 400 shown in FIGS. 4 and 5 are similar to the layouts 600, 700 of FIGS. 6 and 7. The layout styles are not limited to these examples shown in FIGS. 6 and 7. Other layout styles can also be used to realize this invention.

D. Circuit Operating Principles (1) CMOS Normal-Operation Conditions

In CMOS normal operations, VDD is biased at 5V and VSS is grounded. Under this condition, the thin-oxide PMOS and NMOS devices in the PTLSCR and NTLSCR structures 30 and 50 are kept off because their gates are connected to their sources. Thus, PTLSCR and NTLSCR are kept off in CMOS normal-operation conditions. The CMOS output buffer (see 10 of FIG. 1) works to drive/sink current to an external output load connected to the output pad 20.

The parasitic diodes $D_p$ and $D_n$ also perform voltage-level clamping on the output signals. Diode $D_p$ clamps the high-level voltage of an output signal to about VDD+0.6V. Diode $D_n$ clamps the low-level voltage of output signal to about VSS–0.6V. Thus, the voltage level of output signal is clamped between about 5.6V––0.6V in normal CMOS operations with 5V VDD and grounded VSS.

(2) ESD-stress Conditions

When PS-mode ESD events occur, ESD voltage is diverted to the anode (P+ region 91) of NTLSCR 50, and then to the drain 93 (N+ diffusion across the N-well/P-substrate junction in FIG. 3) of thin-oxide NMOS 98 due to the P+ diffusion 91, N-well 58, N+ diffusion 93 forward conducting path. The thin oxide NMOS 98 in NTLSCR 50 is first turned on by means of drain snapback breakdown to clamp the positive ESD voltage on the pad to the voltage level of snapback-breakdown voltage (about 13~5V in 0.8 µm CMOS technology, dependent on CMOS process) of thin-oxide NMOS device 98. As the snapback breakdown occurs in the drain 93 of NMOS device 98, the ESD current is conducted from the N-well 58, through the snapback-breakdown drain 93 of thin-oxide NMOS device 98, to the P-substrate 32, and then to the N+ diffusion 92 in the adjacent N-well 56. This conduction of current from the N-well 58 to P-substrate 32 due to the snapback breakdown of the drain 93 of thin-oxide NMOS device 98 leads to the self-regeneration of latchup in the NTLSCR device 50. Once latchup happens in the NTLSCR 50, a path with very low impedance from the output pad to VSS(GND) is created.

Then, ESD current is mainly discharged through the lateral SCR structure of NTLSCR device. The ESD voltage on the pad 20 is clamped by the holding voltage of the turned-on lateral SCR structure to about 1V so as to protect the output buffer which is connected to this pad. The NTLSCR device 50 can effectively protect CMOS IC's against PS-mode ESD damage alone without adding extra series resistors as discussed above in connection with the prior art. Due to high capability of power delivery, the NTLSCR device can sustain high ESD stress in a small layout area with a lower trigger voltage.

In NS-mode ESD events, ESD stress occurs between the output pad 20 and VSS(GND) with negative polarity to VSS(GND) but with floating VDD. Negative ESD voltage is diverted to the drain of the NMOS device 14 in the CMOS output buffer of FIG. 1. The parasitic diode $D_n$ in the NMOS device is forward biased and turned on to bypass ESD current. The negative ESD voltage on the pad is clamped by the turn-on of diode $D_n$ to about –0.6V so as to protect the output buffer circuit which is connected to this pad. The diode $D_n$ in its forward-conducting condition can perform very high ESD protection capability.

In PD-mode ESD events, ESD stress occurs between the output pad 20 and VDD with positive polarity to VDD but with floating VSS. Positive ESD voltage is diverted to the drain of the PMOS device 12 in the CMOS output buffer of FIG. 1. The parasitic diode $D_p$ in the PMOS device is forward biased and turned on to bypass ESD current. The positive ESD voltage on the pad is clamped by the turn-on of the diode $D_p$ to about 0.6V so as to protect the output buffer circuit which is connected this pad. The diode $D_p$ in its forward-conducting condition can perform very high ESD protection capability.

When ND-mode ESD events occur at the output pad 20 with negative polarity to VDD but with floating VSS, ESD voltage is diverted to the cathode 72 of PTLSCR 30, and then to the drain 80 (see FIG. 2) of thin-oxide PMOS 90 through the P+ diffusion 80/P-substrate 32/N-well 36/N+ diffusion 72 path due to negative ESD voltage on the output pad. The thin-oxide PMOS 90 in PTLSCR 30 is first turned on by means of drain snapback breakdown to clamp the negative ESD voltage on the pad to the voltage level of snapback-breakdown voltage (about –13––15V in 0.8 µm CMOS technology, dependent on CMOS process) of the thin-oxide PMOS device 90. As the snapback breakdown occurs in the drain 80 of the PMOS device 90, the ESD current is conducted from the P+ diffusion 70 (anode of PTLSCR connected to VDD) in the N-well 34, through the snapback-breakdown drain 80 of thin-oxide PMOS device 90 to the P-substrate 32, and then to the N+ diffusion 72 in the adjacent N-well 36 connected to the output pad 20. This conducting current from the N-well to P-substrate due to the snapback-breakdown drain of the thin-oxide PMOS 90 leads to the self-regeneration of latchup in the PTLSCR device 30. Once latchup happens in the PTLSCR 30, a path with very low impedance from VDD to the output pad 20 is created. Then, ESD current is mainly discharged through the lateral SCR structure of the PTLSCR device. The ESD voltage on the pad 20 is clamped by the holding voltage of turn-on lateral SCR structure to about –1V so as to protect the output buffer circuit which is connected to this pad. This PTLSCR device can effectively protect CMOS IC's against ND-mode ESD damages alone without adding extra series resistors as discussed above in connection with the prior art. Due to high capability of power delivery in an SCR device, the PTLSCR device can sustain high ESD stress in a small layout area with a lower trigger voltage.

E. Conclusion

An ESD protection circuit for use in a CMOS output buffer circuit has been disclosed. The ESD protection circuit provides a high ESD failure threshold in a small layout area to protect the output buffer against ESD failure.

The output buffer includes a pull-up PMOS device and pull-down NMOS device whose common drain is connected to an output pad. The source of the PMOS device is connected to VDD and the source of NMOS device is connected to VSS.

The ESD protection circuit is formed by a PTLSCR device and an NTLSCR device. The PTLSCR (NTLSCR) is formed by inserting a short-channel thin-oxide PMOS (NMOS) device into a lateral SCR structure. These MOS devices reduce the turn-on voltage of the lateral SCR to the snapback breakdown voltage of the MOS rather than the original switching voltage of the SCR. The ESD protection circuit also includes two parasitic diodes $D_p$ between output pad and VDD and $D_n$ between output pad and VSS.

The four modes of ESD stresses, PS, NS, PD, ND are one-by-one protected by NTLSCR, $D_n$, $D_p$ and PTLSCR respectively.

The invention can be realized in all CMOS or BiCMOS technologies.

Although there are two additional devices PTLSCR and NTLSCR, used to provide ESD protection, the invention provides higher ESD failure threshold with a smaller layout area than conventional output buffers.

Finally, the above-described embodiments of the invention are intended to be illustrative only. Numerous alternative embodiments may be devised by those skilled in the art without departing from the spirit and scope of the following claims.

We claim:

1. A CMOS output buffer including an ESD protection circuit, said output buffer comprising:

a thin oxide PMOS device and a thin oxide NMOS device, the thin oxide PMOS device having a source connected to VDD and the thin oxide NMOS device having a source connected to VSS, said PMOS and NMOS devices having drains which are connected to each other and to an output pad, a first low voltage trigger SCR device connected between VDD and the output pad to protect against ND-mode ESD stress, a second low voltage trigger SCR device connected between the output pad and VSS to protect against PS-mode ESD stress, a first parasitic diode connected between VDD and the output pad to protect against PD mode ESD stress and a second parasitic diode connected between the output pad and VSS to protect against NS mode ESD stress.

2. The CMOS output buffer of claim 1 wherein said output buffer has a P-well/N-substrate structure.

3. The CMOS output buffer of claim 1 wherein said output buffer has an N-well/P-substrate structure.

4. The CMOS output buffer of claim 1 wherein said first low voltage trigger SCR comprises a lateral SCR whose anode is connected to VDD and whose cathode is connected to the output pad and a PMOS device which triggers the lateral SCR at the snapback breakdown voltage of the PMOS device.

5. The CMOS output buffer of claim 1 wherein said second low voltage trigger SCR comprises a lateral SCR whose anode is connected to the output pad and whose cathode is connected to VSS and an NMOS device which triggers the lateral SCR at the snapback breakdown voltage of the NMOS device.

6. A CMOS output buffer including an ESD protection circuit, said output buffer comprising a first PMOS and a first NMOS device whose drains are connected to an output pad and whose sources are connected to first and second supply voltages, respectively, a first lateral SCR whose anode is connected to the first supply voltage and whose cathode is connected to the output pad and which includes a second PMOS device which triggers the first lateral SCR at the snapback breakdown voltage of the second PMOS device, and a second lateral SCR whose anode is connected to the output pad and whose cathode is connected to the second supply voltage and a second NMOS device which triggers the second lateral SCR at the snapback breakdown voltage of the second PMOS device.

7. The CMOS output buffer of claim 6, further including a first parasitic diode connected between the output pad and the first supply voltage.

8. The CMOS output buffer of claim 7, further comprising a second parasitic diode connected between the output pad and the second supply voltage.

9. A semiconductor device for providing ESD protection for an output buffer in an integrated circuit comprising a first low voltage trigger lateral SCR formed in a semiconductor substrate whose anode is connected to a first supply voltage and whose cathode is connected to an output pad of said integrated circuit, said first lateral SCR incorporating a PMOS device for triggering said lateral SCR at a snapback breakdown voltage of the PMOS device, and a second low voltage trigger lateral SCR formed integrally with said first low voltage trigger lateral SCR whose anode is connected to the output pad and whose cathode is connected to a second supply voltage, said second lateral SCR incorporating an NMOS device for triggering said second lateral SCR at a snapback breakdown voltage of the NMOS device.

10. The semiconductor of claim 9 wherein said cathode of said second lateral SCR comprises a $P^+$ region formed in an N-well which is in a P-substrate.

11. The semiconductor of claim 9 wherein said cathode of said second lateral SCR comprises a $P^+$ region formed in a P-well which is in an N-substrate.

12. The semiconductor device of claim 9 wherein said NMOS device has a drain formed across a junction of said substrate and a first well in said substrate, and has a source formed across a junction of said substrate and a second well, said substrate being of one dopant type, and said first well and said second well being of another dopant type.

13. The semiconductor device of claim 9 wherein said drain is an $N^+$ region.

14. The semiconductor device of claim 9 further comprising a thin oxide NMOS device formed integrally with said second low voltage trigger lateral SCR, wherein a drain of said thin oxide NMOS device is formed in a substrate by parallel $N^+$ regions, and wherein said second lateral SCR is parallel to said thin oxide NMOS device.

* * * * *